(12) United States Patent
Jang et al.

(10) Patent No.: US 7,434,120 B2
(45) Date of Patent: Oct. 7, 2008

(54) TEST MODE CONTROL CIRCUIT

(75) Inventors: Ji-Eun Jang, Kyoungki-do (KR);
Kee-Teok Park, Kyoungki-do (KR)

(73) Assignee: Hynix Semiconductor Inc. (KR)

( * ) Notice: Subject to any disclaimer, the term of this patent is extended or adjusted under 35 U.S.C. 154(b) by 208 days.

(21) Appl. No.: 11/323,382

(22) Filed: Dec. 29, 2005

(65) Prior Publication Data

US 2007/0050692 A1    Mar. 1, 2007

(30) Foreign Application Priority Data

Aug. 29, 2005    (KR) .................... 10-2005-0079598

(51) Int. Cl.
G11C 29/00    (2006.01)
(52) U.S. Cl. .................... 714/718; 714/5; 714/724; 714/733; 714/734; 714/742; 365/201; 365/222
(58) Field of Classification Search .............. None
See application file for complete search history.

(56) References Cited

U.S. PATENT DOCUMENTS

| 5,905,690 | A  | * | 5/1999  | Sakurai et al. ............. 365/233 |
| 6,256,240 | B1 | * | 7/2001  | Shinozaki .................. 365/201 |
| 6,343,048 | B1 | * | 1/2002  | Jung ......................... 365/233 |
| 6,392,909 | B1 |   | 5/2002  | Jang et al. |
| 6,633,504 | B1 | * | 10/2003 | Lee et al. ................... 365/222 |
| 6,809,975 | B2 | * | 10/2004 | Yamaoka et al. ........... 365/201 |
| 6,862,667 | B2 | * | 3/2005  | Asakawa et al. ............ 711/153 |
| 6,909,650 | B2 |   | 6/2005  | Ryu et al. |
| 7,017,090 | B2 | * | 3/2006  | Endou et al. ................ 714/718 |
| 7,035,753 | B2 | * | 4/2006  | Gerstmeier et al. ......... 702/120 |
| 7,107,500 | B2 | * | 9/2006  | Jang ........................... 714/718 |
| 2002/0014635 | A1 | * | 2/2002  | Lee et al. .................... 257/200 |
| 2002/0167859 | A1 | * | 11/2002 | Chun ......................... 365/233 |
| 2003/0026139 | A1 |   | 2/2003  | Endou et al. |
| 2004/0252564 | A1 | * | 12/2004 | Do ............................. 365/201 |
| 2006/0036916 | A1 | * | 2/2006  | Janzen ........................ 714/718 |

FOREIGN PATENT DOCUMENTS

| JP | 2001195898       | 7/2001  |
| JP | 2004014037       | 1/2004  |
| JP | 2005116167       | 4/2005  |
| KR | 10-2004-0095892  | 11/2004 |
| KR | 10-2005-0003062  | 1/2005  |
| KR | 10-2005-0058873  | 6/2005  |
| KR | 10-2005-0064597  | 6/2005  |

* cited by examiner

Primary Examiner—John P Trimmings
(74) Attorney, Agent, or Firm—Blakely, Sokoloff, Taylor & Zafman

(57) ABSTRACT

Provided is a test mode control circuit capable of preventing an MRS (mode register set) from changing in a test mode exit after a test mode entry. In the test mode control circuit, an MRS controller logically combines an MRS signal, a bank address, an MRS address, and a test mode control signal to output a latch control signal. A test mode control unit detects a test mode entry and a test mode exit to selectively activate one of a test mode set signal and a test mode exit signal, and outputs the test mode control signal having different voltage levels according to an activation state of the test mode set signal or the test mode exit signal. An address latch latches an input address when the MRS signal is activated, and outputs the latched input address as the MRS address when the latch control signal is activated.

8 Claims, 4 Drawing Sheets

TEST MODE CONTROL CIRCUIT

FIELD OF THE INVENTION

The present invention relates to a semiconductor device; and, more particularly, to a test mode control circuit in which a mode register set (MRS) does not change when a synchronous dynamic random access memory (SDRAM) exits from a test mode, thereby preventing unnecessary operation of the MRS.

DESCRIPTION OF THE RELATED ART

FIG. 1 is a circuit diagram of a conventional test mode control circuit.

As shown, the conventional test mode control circuit includes a mode register set (MRS) control unit 100 and an address latch unit 200.

The MRS control unit 100 includes a delay unit 10, an inverter INV1, and NAND gates ND1 and ND2.

The delay unit 10 delays an MRS signal MRSP6. The NAND gate ND1 performs a NAND operation on an output signal of the delay unit 10, a bank address EAT_BK<0>, and an output signal of the inverter INV1 receiving an MRS address ADD<7>. The NAND gate ND2 performs a NAND operation on a power-up signal PWRUP and an output signal of the NAND gate ND1 to output a latch control signal MRS_LATP. The number of the latch control signal MRS_LATP is equal to the number of addresses for the MRS.

The address latch unit 200 includes inverters INV2 to INV8, transmission gates TG1 and TG2, and an NMOS transistor N1.

The transmission gate TG1 selectively outputs an input address ADDRESS according to states of the MRS address ADD<7>. The NMOS transistor N1 precharges an output terminal of the transmission gate TG1 to a ground voltage level in response to an output signal of the inverter INV3 receiving a power-up signal PWRUP.

A latch configured with the inverters INV4 and INV5 latches an output signal of the transmission gate TG1 for a predetermined time. The transmission gate TG2 selectively outputs an output signal of the latch configured with the inverters INV4 and INV5 according to the latch control signal MRS_LATP. A latch configured with the inverters INV7 and INV8 latches an output signal of the transmission gate TG2 for a predetermined time and outputs an MRS address MRS_ADD.

FIG. 2 is a circuit diagram of a test mode control unit 300 in the conventional test mode control circuit.

Referring to FIG. 2, the test mode control unit 300 includes inverter INV9 to INV11 and NAND gates ND3 and ND4.

The NAND gate ND3 performs a NAND operation on the MRS signal MRSP6 and the MRS address ADD<7>. The NAND gate ND4 performs a NAND operation on the MRS signal MRSP6 and an output signal of the inverter INV9 receiving the MRS address ADD<7>. The inverter INV10 inverts an output signal of the NAND gate. ND3 to output a test mode set signal TM_SET. The inverter INV11 inverts an output signal of the NAND gate ND4 to output a test mode exit signal TM_EXIT.

An operation of the conventional test mode control circuit will be described with reference to FIG. 3.

Referring to FIG. 3, when an MRS command is inputted, the MRS signal MRSP6 is set to a high level. At this point, the transmission gate TG1 is turned on so that the external input address ADDRESS is outputted to the latch configured with the inverters INV4 and INV5.

Thereafter, when the MRS signal MRSP6 delayed by the delay unit 10 and the MRS address ADD<7> are set to a low level and the address bank address EAT_BK<0> is set to a high level, the MRS is executed so that the latch control signal MRS_LATP is set to a high level.

Accordingly, the transmission gate TG2 is turned on, and a latch configured with the inverters INV7 and INV8 latches the output of the latch configured with the inverters INV4 and INV5 for a predetermined time and then outputs the MRS address MRS_ADD. The MRS address MRS_ADD is decoded to set the corresponding CL and BL.

Meanwhile, when the MRS signal MRSP6 and the MRS address ADD<7> are set to a high level, the test mode is started so that the test mode set signal TM_SET is set to a high level. On the contrary, when the MRS signal MRSP6 and the MRS address ADD<7> are set to a low level, the test mode is exited so that the test mode exit signal TM_EXIT is set to a high level.

However, the condition of setting the MRS and the condition of exiting the test mode are all identical to each other, except that the test mode is not under control of the bank address. If the bank address EAT_BK<0> is set to "0", the previously set mode register setting information (that is, CL and BL setting information) can change at the point that the test mode exits. Accordingly, the MRS operation has to operate in the test mode entry or the test mode exit.

SUMMARY OF THE INVENTION

It is, therefore, an object of the present invention to provide a test mode control circuit capable of preventing an MRS from changing in a test mode exit after a test mode entry by detecting the test mode entry in a register setting and making an MRS operation not operate even though an MRS signal is inputted after the test mode entry.

In accordance with an aspect of the present invention, there is provided a test mode control circuit, including: an MRS (mode register set) controller for logically combining an MRS signal, a bank address and an MRS address to output a latch control signal wherein the latch control signal is inactivated when a test mode control signal is activated; a test mode control unit for detecting a test mode entry and a test mode exit and outputting the test mode control signal in response to the detecting result wherein the test mode control signal is activated during test mode; and an address latch for latching and outputting an input address when the latch control signal is activated wherein The input address ADDRESS has set mode register setting information.

BRIEF DESCRIPTION OF THE DRAWINGS

The above and other objects and features of the present invention will become apparent from the following description of the preferred embodiments given in conjunction with the accompanying drawings, in which.

DETAILED DESCRIPTION OF THE INVENTION

A test mode control circuit in accordance with exemplary embodiments of the present invention will be described in detail with reference to the accompanying drawings.

Figure 1:
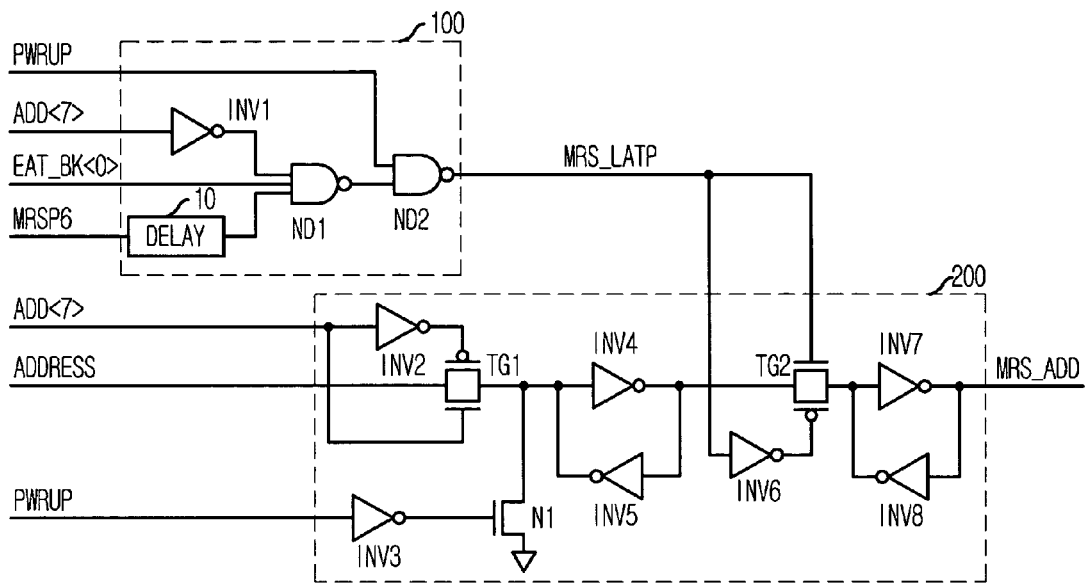
FIG. 1 is a circuit diagram of an address latch in a conventional test mode control circuit.
Figure 2:
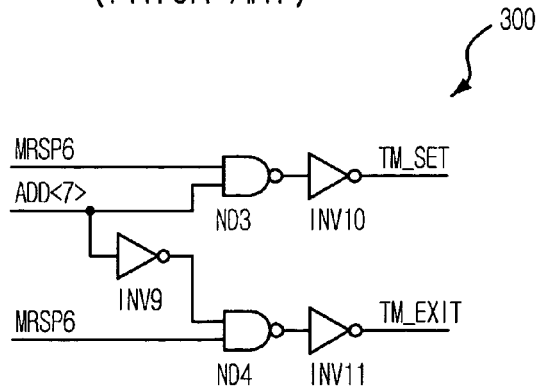
FIG. 2 is a circuit diagram of a test mode control unit in the conventional test mode control circuit.
Figure 3:
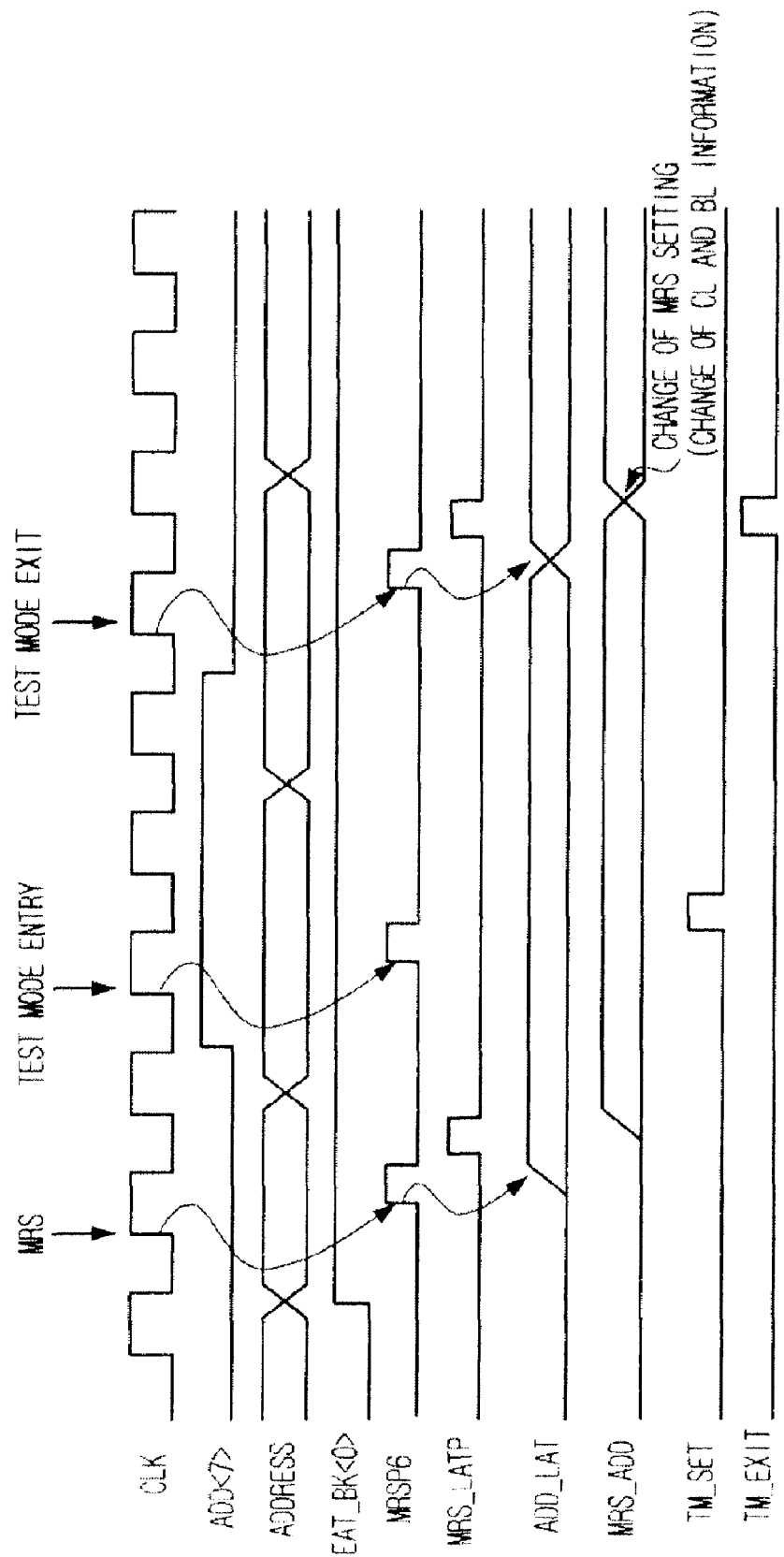
FIG. 3 is a waveform diagram of signals used in the conventional test mode control circuit.
Figure 4:
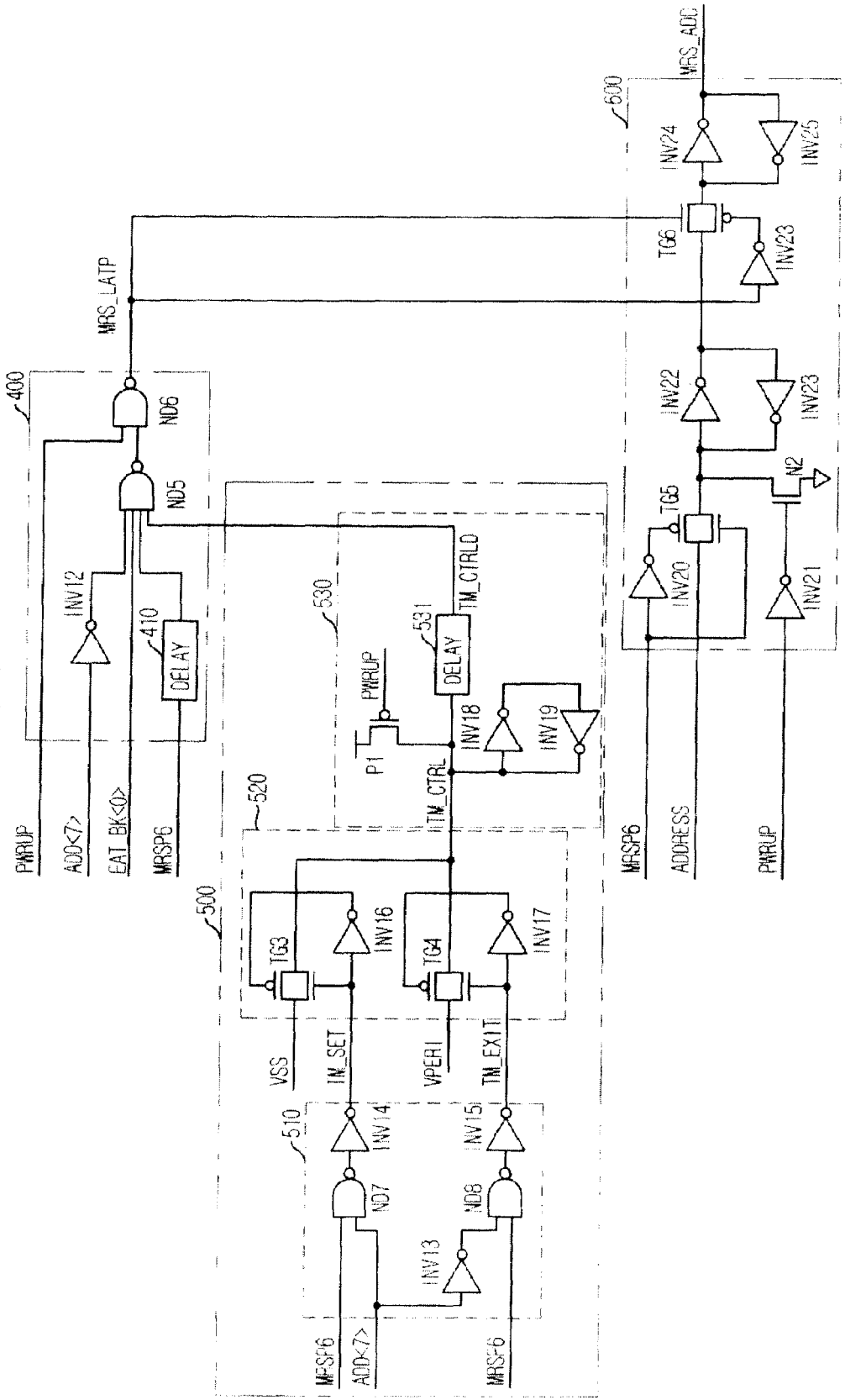
FIG. 4 is a circuit diagram of a test mode control circuit in accordance with an embodiment of the present invention.

FIG. 4 is a circuit diagram of a test mode control circuit in accordance with an embodiment of the present invention.

Referring to FIG. 4, the test mode control circuit includes an MRS controller 400, a test mode controller 500, and an address latch 600.

The MRS controller 400 includes a delay unit 410, an inverter INV12, NAND gates ND5 and ND6.

The delay unit 410 delays an MRS signal MRSP6 by a predetermined time. The NAND gate ND5 performs a NAND operation on an output signal of the delay unit 410, a bank address EAT_BK<0>, an output signal of the inverter INV12 receiving an MRS address ADD<7>, and a test mode control signal TM_CTRLD. The NAND gate ND6 performs a NAND operation on a power-up signal PWRUP and an output signal of the NAND gate ND5 and outputs a latch control signal MRS_LATP. The number of the latch control signal MRS_LATP is equal to the number of addresses for the MRS.

The test mode controller 500 includes a test mode detecting unit 510, a test mode selecting unit 520, and a test mode delaying unit 530.

The test mode detecting unit 510 includes inverters INV13 to INV15 and NAND gates ND7 and ND8.

The NAND gate ND7 performs a NAND operation on the MRS signal MRSP6 and the MRS address ADD<7>. The NAND gate ND8 performs a NAND operation on an output signal of the inverter INV13 receiving the MRS address ADD<7> and the MRS address MRSP6. The inverter INV14 inverts an output signal of the NAND gate ND7 to output a test mode set signal TM_SET. The inverter INV15 inverts an output signal of the NAND gate ND8 to output a test mode exit signal TM_EXIT.

The test mode selecting unit 520 includes inverters INV16 to INV17 and transmission gates TG3 and TG4.

The transmission gate TG3 outputs the test mode control signal of a ground voltage level VSS in response to the test mode set signal TM_SET. The transmission gate TG4 outputs the test mode control signal TM_CTRL of a peripheral voltage level VPERI in response to the test mode exit signal TM_EXIT.

The test mode delaying unit 530 includes a PMOS transistor P1, inverters INV18 and INV19, and a delay 531.

A latch configured with the inverters INV18 and INV19 latches the test mode control signal TM_CTRL for a predetermined time. The PMOS transistor P1 precharges the test mode control signal TM_CTRL to a power supply voltage level in response to the power-up signal PWRUP. The delay 531 delays the test mode control signal TM_CTRL by a predetermined time to output the test mode control signal TM_CTRLD. The delay 531 can be configured with a CMOS gate logic (inverter), a resistor, or a capacitor.

The address latch 600 includes inverters INV20 to INV25, transmission gates TG5 and TG6 and an NMOS transistor N2.

The transmission gate TG5 selectively outputs an input address ADDRESS in response to the MRS address ADD<7>. The input address ADDRESS has set mode register setting information (that is, CL and BL setting information). The NMOS transistor N2 precharges an output terminal of the transmission gate TG5 in response to an output signal of the inverter INV21 receiving the power-up signal PWRUP.

A latch configured with the inverters INV22 and INV23 latches an output signal of the transmission gate TG5 for a predetermined time. The transmission gate TG6 selectively outputs the output signals of the latch configured with the inverters INV22 and INV23. A latch configured with the inverters INV24 and INV25 latches an output signal of the transmission gate TG6 for a predetermined time to output the MRS address MRS_ADD.

Figure 5:
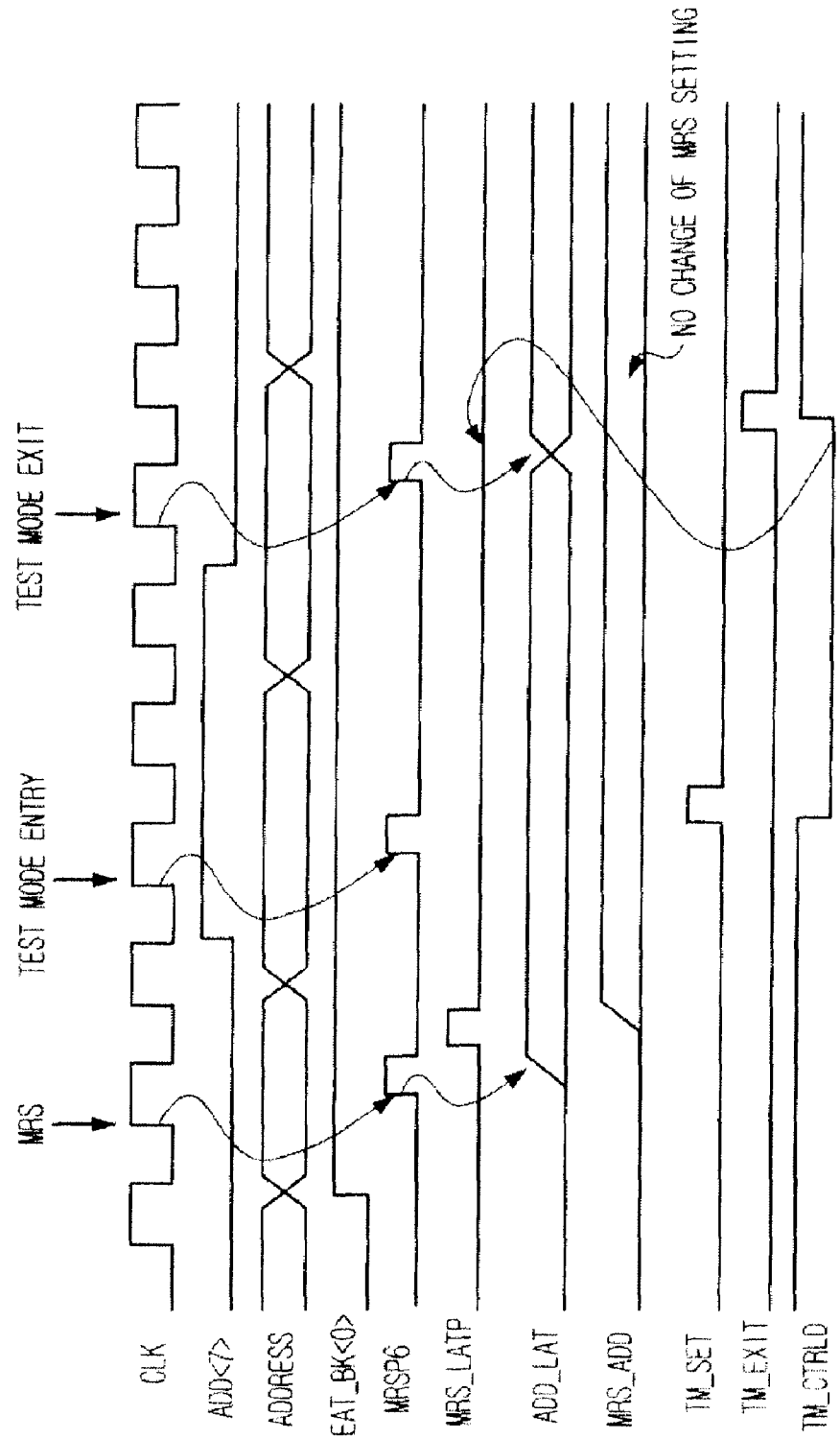
FIG. 5 is a waveform diagram of signals used in the test mode control circuit in the embodiment of the present invention.

An operation of the test mode control circuit will be described below with reference to FIG. 5.

First, when the MRS signal MRSP6 and the MRS address ADD<7> are set to a high level, the test mode set signal TM_SET is set to a high level in the test mode entry. That is, when the test mode set signal TM_SET is set to a high level in the test mode entry, the transmission gate TG3 is turned on. Accordingly, the test mode control signal TM_CTRL of the ground voltage level VSS is outputted. The test mode control signal TM_CTRL is delayed for a predetermined time, and thus, the test mode control signal TM_CTRLD of the ground voltage level VSS is outputted.

When the MRS command is inputted, the MRS signal MRSP6 is set to a high level. At this point, the transmission gate TG5 is turned on so that the external input address ADDRESS is outputted to the latch configured with the inverters INV22 and INV23.

Afterwards, when executing the MRS command, the MRS signal MRSP6 delayed by the delay unit 410 and the MRS address ADD<7> are set to a low level, and the bank address EAT_BK<0> is set to a high level. The test mode control signal TM_CTRLD of the ground voltage level VSS is inputted to the NAND gate ND5.

Accordingly, the output signal of the NAND gate ND5 is always in a high level so that the latch control signal MRS_LATP is set to a low level. In the test mode entry, the transmission gate TG6 is maintained in the turned-off state so that the MRS address MRS_ADD is not outputted.

Consequently, the test mode control circuit in accordance with the embodiment of the present invention detects the test mode entry/exit when the mode register is set, and the mode register setting operation is made not to operate even though the MRS signal is inputted after the test mode entry. Therefore, it is possible to prevent the MRS from changing in the test mode exit after the test mode entry.

Meanwhile, when the MRS signal MRSP6 and the MRS address ADD<7> are set to a low level, the test mode exit signal TM_EXIT is set to a high level. When the test mode exit signal TM_EXIT is set to a high level, the transmission gate TG4 is turned on. Accordingly, the test mode control signal TM_CTRL of the peripheral voltage level VPERI is outputted. The test mode control signal TM_CTRL is delayed for a predetermined time and the test mode control signal TM_CTRLD of the peripheral voltage level VPERI is outputted.

When the MRS command is inputted, the MRS signal MRSP6 is set to a high level. At this point, the transmission gate TG5 is turned on so that the external input address ADDRESS is outputted to the latch configured with the inverters INV22 and INV23. Afterwards, when the MRS command is executed, the MRS signal MRSP6 delayed by the delay unit 410 and the MRS address ADD<7> are set to a low level, and the bank address EAT_BK<0> is set to a high level. The test mode control signal TM_CTRLD of the peripheral voltage level VPERI is inputted to the NAND gate ND5.

Accordingly, the output signal of the NAND gate ND5 is set to a low level so that the latch control signal MRS_LATP is set to a high level. In the test mode exit, the transmission gate TG6 is turned on so that the signal latched by the latch configured with the inverters INV22 and INV23 is outputted as the MRS address MRS_ADD. The MRS address MRS_ADD is decoded to set the corresponding CL and BL.

As described above, unnecessary MRS operation can be prevented by making the MRS information not to change in the test mode exit after the test mode entry.

The present application contains subject matter related to the Korean patent application No. KR 2005-0079598, filed in the Korean Patent Office on Aug. 29, 2005, the entire contents of which being incorporated herein by reference.

While the present invention has been described with respect to the particular embodiments, it will be apparent to those skilled in the art that various changes and modifications may be made without departing from the scope of the invention as defined in the following claims.

What is claimed is:

1. A test mode control circuit comprising:
    an MRS (mode register set) controller for logically combining an MRS signal, a bank address, an MRS address and a test mode control signal to output a latch control signal wherein the latch control signal is inactivated when the test mode control signal is activated;
    a test mode control unit for detecting a test mode entry and a test mode exit and outputting the test mode control signal in response to the detecting result wherein the test mode control signal is activated during a test mode; and
    an address latch for latching and outputting an input address as the MRS address in response to the latch control signal, wherein the MRS address is outputted when the latch control signal is activated;
    wherein the test mode control unit includes:
        a test mode detecting unit for detecting the test mode entry and the test mode exit according to the MRS signal and the MRS address;
        a test mode selecting unit for outputting the test mode control signal of a ground voltage level when a test mode set signal is activated, and outputting the test mode control signal of a peripheral voltage level when a test mode exit signal is activated, wherein the test mode set signal is activated when the test mode detecting unit detects the test mode entry, and the test mode exit signal is activated when the test mode detecting unit detects the test mode exit; and
        a test mode delaying unit for latching and delaying the test mode control signal for a predetermined time.

2. The test mode control circuit of claim 1, wherein, in an execution of the MRS signal, the MRS controller deactivates the latch control signal when the test mode control signal is set to a low level, and activates the latch control signal when the test mode control signal is set to a high level.

3. The test mode control circuit of claim 1, wherein the MRS controller includes:
    a first logical operation unit for performing a logical operation on the MRS signal delayed by a predetermined time, an inverted MRS address, the bank address, and the test mode control signal; and
    a second logical operation unit for performing a logical operation on an output signal of the first logical operation unit and a power-up signal to output the latch control signal.

4. The test mode control circuit of claim 1, wherein the test mode detecting unit includes:
    a third logical operation unit for performing a logical operation on the MRS signal and the MRS address to output the test mode set signal; and
    a fourth logical operation unit for performing a logical operation on the MRS signal and an inverted MRS address to output the test mode exit signal.

5. The test mode control circuit of claim 1, wherein the test mode selecting unit includes:
    a first transmission gate for outputting the test mode control signal of the ground voltage level in response to the test mode set signal; and
    a second transmission gate for outputting the test mode control signal of the peripheral voltage level in response to the test mode exit signal.

6. The test mode control circuit of claim 1, wherein the test mode delaying unit includes:
    a first latch for latching the test mode control signal for a predetermined time;
    a first precharge unit for precharging an output terminal of the first latch to a power supply voltage level in response to a power-up signal; and
    a delay for delaying the test mode control signal for a predetermined time.

7. The test mode control circuit of claim 1, wherein the address latch latches the input address in the test mode entry, blocks an output path of the MRS address when the latch control signal is deactivated, and outputs the latched input address as the MRS address in the test mode exit.

8. The test mode control circuit of claim 1, wherein the address latch includes:
    a third transmission gate for selectively outputting the input address according to activation states of the MRS signal;
    a second precharge unit for precharging an output of the third transmission gate to a ground voltage level when a power-up signal is activated;
    a second latch for latching an output signal of the third transmission gate;
    a fourth transmission gate for selectively outputting the latched signal of the second latch according to activation states of the latch control signal; and
    a third latch for latching an output signal of the fourth transmission gate for a predetermined time and outputting the latched signal as the MRS address.

* * * * *